US006253281B1

(12) United States Patent
Hall

(10) Patent No.: US 6,253,281 B1
(45) Date of Patent: *Jun. 26, 2001

(54) METHOD FOR UPDATING FIRMWARE OF A COMPUTER PERIPHERAL DEVICE

(75) Inventor: Trevor G. R. Hall, Twickenham (GB)

(73) Assignee: U.S. Philips Corporation, New York, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/094,831

(22) Filed: Jun. 15, 1998

(30) Foreign Application Priority Data

Jun. 21, 1997 (GB) .................................. 9713094

(51) Int. Cl.[7] ..................................... G06F 12/00
(52) U.S. Cl. ........................................ 711/112; 711/103
(58) Field of Search .................................. 711/102, 103, 711/111, 112, 163, 152

(56) References Cited

U.S. PATENT DOCUMENTS

| 5,327,531 | 7/1994 | Bealkowski et al. ............... 395/164 |
| 5,535,355 | 7/1996 | Scales ................................ 395/428 |
| 5,537,654 * | 7/1996 | Bedingfield et al. ............... 395/834 |
| 5,579,522 | 11/1996 | Christeson et al. ................ 395/652 |
| 5,630,139 | 5/1997 | Ozaki ................................ 395/712 |
| 5,987,581 * | 11/1999 | Nale ................................. 711/202 |
| 6,012,961 * | 1/2000 | Sharpe, III et al. ............... 446/298 |

FOREIGN PATENT DOCUMENTS

| 0376488A2 | 7/1990 | (EP) . |
| 0393631A2 | 10/1990 | (EP) . |
| 2013378A | 8/1979 | (GB) . |
| 08161160A | 6/1996 | (JP) . |

* cited by examiner

*Primary Examiner*—Kevin Verbrugge
(74) *Attorney, Agent, or Firm*—Michael E. Belk

(57) ABSTRACT

An optical disc drive includes a system controller in the form of a microcontroller and a FLASH memory which holds program code for the micro controller. The FLASH memory is formed in two areas, the first being a protected area in which the code cannot be changed and the second being an unprotected area in which the micro controller can write updated program code. The updated code is received from a host computer over an interface (28). The code in the protected area and in the micro controller ROM is sufficient to enable the basic functions of requesting and receiving program code from the host computer and writing the received program code into the unprotected area of the FLASH memory to be performed. This enables recovery of the drive if the code in the unprotected area becomes corrupted, for example if a power supply failure occurs during transfer of the code.

19 Claims, 4 Drawing Sheets

METHOD FOR UPDATING FIRMWARE OF A COMPUTER PERIPHERAL DEVICE

The invention relates to optical disc drives and to a method of updating such disc drives by entering new programming instructions into memory accessed by a microprocessor based system controller within the disc drive.

Such disc drives are usually connected to a host computer, frequently a personal computer (PC), through a standard interface so that data read from the optical disc may be read by the PC. Examples of the optical discs are CD ROM, DVD ROM, and re-writable versions of such discs.

In-System programming of CD ROM drive firmware is a desirable feature which enables the updating of the drive to provide extra functionality or to correct operational errors which have been detected. This may be achieved by downloading new program code to the program memory of the system controller which may typically comprise a FLASH ROM. Thus the user may purchase or be supplied with a floppy disc or other data carrier containing the updated operating program for the drive which is then read by the PC and sent via a standard interface to the disc drive system controller to enable updating of the disc drive firmware. The disc drive includes non-volatile memory, typically a FLASH memory to store the program instructions for the system controller (hereinafter referred to as a microcontroller). The normally accepted technique for programming this FLASH memory is first to copy the programming software from the FLASH memory to the microcontroller RAM space, then to activate a hardware switch to cause the microcontroller to recognise the RAM as the program memory. The microcontroller now executes its program code from the RAM and is enabled to erase the code stored in the FLASH memory and rewrite it with that supplied from the host PC. Once the FLASH memory has been rewritten the microcontroller reverts to using the updated FLASH memory as the program memory.

This approach has the disadvantage that a power failure during this process may be fatal, i.e. if it occurs after the FLASH memory has been erased but before it has been rewritten the contents of both the FLASH memory and the RAM are lost and there is no program for the microcontroller to execute. Thus if power to the disc drive is lost at that critical time the user is left with an inoperative disc drive which has to be returned to the manufacturer or a service operation to have the original or updated program written into the FLASH memory. This is clearly an undesirable situation.

It is an object of the invention to enable the provision of a disc drive whose operating program can be updated by transferring the updated program instructions from the last computer which is more robust to power failures during such transfer.

One approach to solving this problem is to provide an "uninterruptable" power supply, for example a battery backup to the critical parts of the drive, in particular the RAM in which the program code is stored before being transferred into the FLASH memory or other non volatile memory. This approach has been implemented but leads to increased cost for the optical disc drive.

The invention provides a method of updating program code held in a non volatile memory for a microcontroller which controls the operation of an optical disc drive connected to a host computer, the method comprising the steps of;

1). providing in a protected non-erasable area of the non-volatile memory a basic operating program code which enables the micro controller to check the integrity of the program code in the remaining unprotected area of the non-volatile memory and to request and receive program code form the host computer, 2). providing in a read only memory of the microcontroller low level program code which enables the micro processor to erase data from and write data to the unprotected area of the non-volatile memory, 3). requesting the host computer to supply updated program code, 4). writing the updated program code into random access memory (RAM) within the disc drive, 5). erasing program code from at least a selected portion of the unprotected area of the non-volatile memory, and 6). transferring the updated program code from the RAM into the selected portion of the non volatile memory.

The method according to the invention has the advantage that if the transfer of the updated code is not satisfactorily executed, for example because of a power supply interruption at a critical stage, the drive is able to recover and repeat the attempt to transfer the updated code. This is achieved by including enough program code in protected memory to enable a check to be made as to the success in transferring the code, i.e. to perform an integrity check on the stored program code, and to control the writing of program code to the unprotected area of the non-volatile memory.

Thus if the transfer of updated code is not successful a visible or audible warning may be produced which will inform the user that a further attempt to read the program code from the host computer should be made. Although the main purpose of this procedure is to enable recovery of the disc drive if a faulty transfer of updated program code is made it can also be used to recover the correct program code if it should become corrupted for any other reason.

The invention further provides a disc drive comprising a micro controller for controlling the operation of the disc drive in response to program code stored in a non volatile memory, the non volatile memory comprising a first protected area where code is protected from erasure and a second non-protected area where code can be re-written under the control of the micro controller, said first area containing program code to enable the micro controller to verify the integrity of the program code in the second area, means for requesting updated program code from a host computer to which the disc drive is connected, and means for writing the received updated program code into a random access memory (RAM), wherein the micro controller comprises program code stored in read only memory which enables the microcontroller to erase and re-write code into the second area of the non-volatile memory, the micro controller being arranged, in response to a user request and the program code in the first area of the non volatile memory and the read only memory, to transfer the updated program code from the RAM to the second area of the non-volatile memory.

Such a disc drive can be reprogrammed in the field to update its functionality by providing new program code on a floppy disc or other medium which can be read by the host computer and transferred over a standard interface to the non-volatile memory of the microcontroler. It can also be reactivated if a fault resulting in corruption of the program code in the non volatile memory occurs if the appropriate program code is available in or to the host computer.

The above and other features and advantages of the invention will be apparent from the following description, by way of example, of an embodiment of the invention with reference to the accompanying drawings in which.

Figure 1:
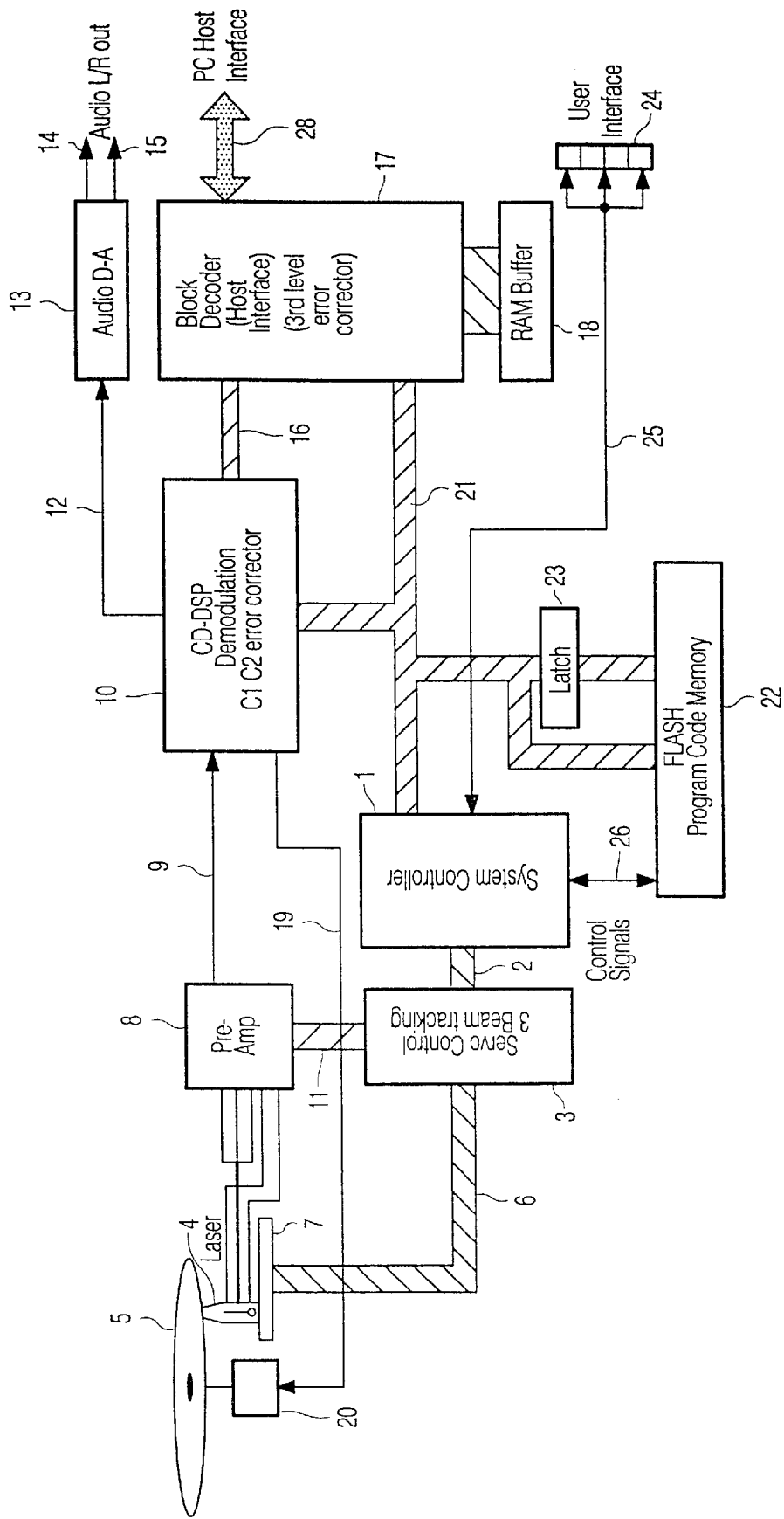
FIG. 1 is a block diagram of an optical disc drive according to the invention.

FIG. 1 shows an optical disc drive according to the invention in the form of a CD ROM drive. As shown in FIG. 1 the drive includes a system controller 1 which may take the form of an 8051 microcontroller, for details of which the reader is referred to Data Book IC 20 published by Philips Semiconductors. The microcontroller 1 is connected via a bus 2 to a servo control and three beam tracking circuit 3 which controls the movement of a laser read head 4 relative to tracks on the CD ROM disc 5 via a bus 6 and drive circuits 7. Signals from the laser read head 4 are fed to a preamplifier 8 where they are split into a data signal which is fed via a line 9 to a demodulation and error correction circuit 10 and tracking control signals which are fed via a bus 11 to the servo control and three beam tracking circuit 3. Data representing audio signals is fed from a first output of the demodulation and error correction circuit 10 over a line 12 to audio digital to analogue (D-A) converters 13 to provide audio outputs at terminals 14 and 15. Data read from the disc 5 is fed via a bus 16 from a second output of the demodulation and error correction circuit 10 to a block decoder 17. The block decoder 17 has associated RAM 18 and also includes a standard interface to the host computer enabling data to be transferred to and from the host computer over a bus 28. The block decoder 17 may take the form of an integrated circuit such as that manufactured and sold by Philips Semiconductors under the type reference SAA7391. A third output of the demodulation and error correction circuit 10 is fed via a line 19 to a spindle motor 20 which rotates the disc 5 at a controlled speed so that data is read from the disc 5 at a desired data rate.

A bus 21 interconnects the system microcontroller 1, the demodulation and error correction circuit 10, the block decoder 17 and a FLASH memory 22 which contains the program code for the system controller 1. A latch 23 is provided to allow address bits AD7–AD0 to share the bus with data bits D7–D0. A user interface 24 is connected to the microcontroller 1 via a path 25 to enable user commands to be input, for example to open or close the drawer for loading or unloading the disc and to enable status indications to be made, for example to illuminate an indicator to show that the drive is in operation. A number of control signals from the microcontroller 1 to the FLASH memory 22 are fed over a path 26.

The disc drive shown in FIG. 1 operates conventionally to read data from the disc 5 and pass it to the host computer and will access appropriate tracks on the disc 5 in response to instructions passed from the host computer using the system controller 1 operating in accordance with the programs stored in the FLASH memory 22.

When, however, an operating system update is received by a user the disc drive is arranged to read the new programming information from the host computer and to receive and store it in a more secure fashion than with prior art drives. This is achieved by including basic bootstrapping program instructions for the microcontroller 1 in a protected portion of the FLASH memory 22 which cannot be erased and which checks whether the program information in the rest of the FLASH memory 22 is complete and uncorrupted and further program instructions in ROM embedded in the microcontroller 1, the further program instructions being those required to enable the microcontroller to transfer data from the RAM 18 to the FLASH memory 22. Consequently, if a power failure is experienced which results in the program code being erased from both the FLASH memory 22 (because it appears after the microcontroller 1 has performed the erase function but before it has written the new code from the RAM 18) and from the RAM 18 the drive can recover by re-reading the program instructions from the host computer as there are sufficient program instructions in the protected part of the FLASH memory 22 and the ROM within the microcontroller 1.

Figure 2:
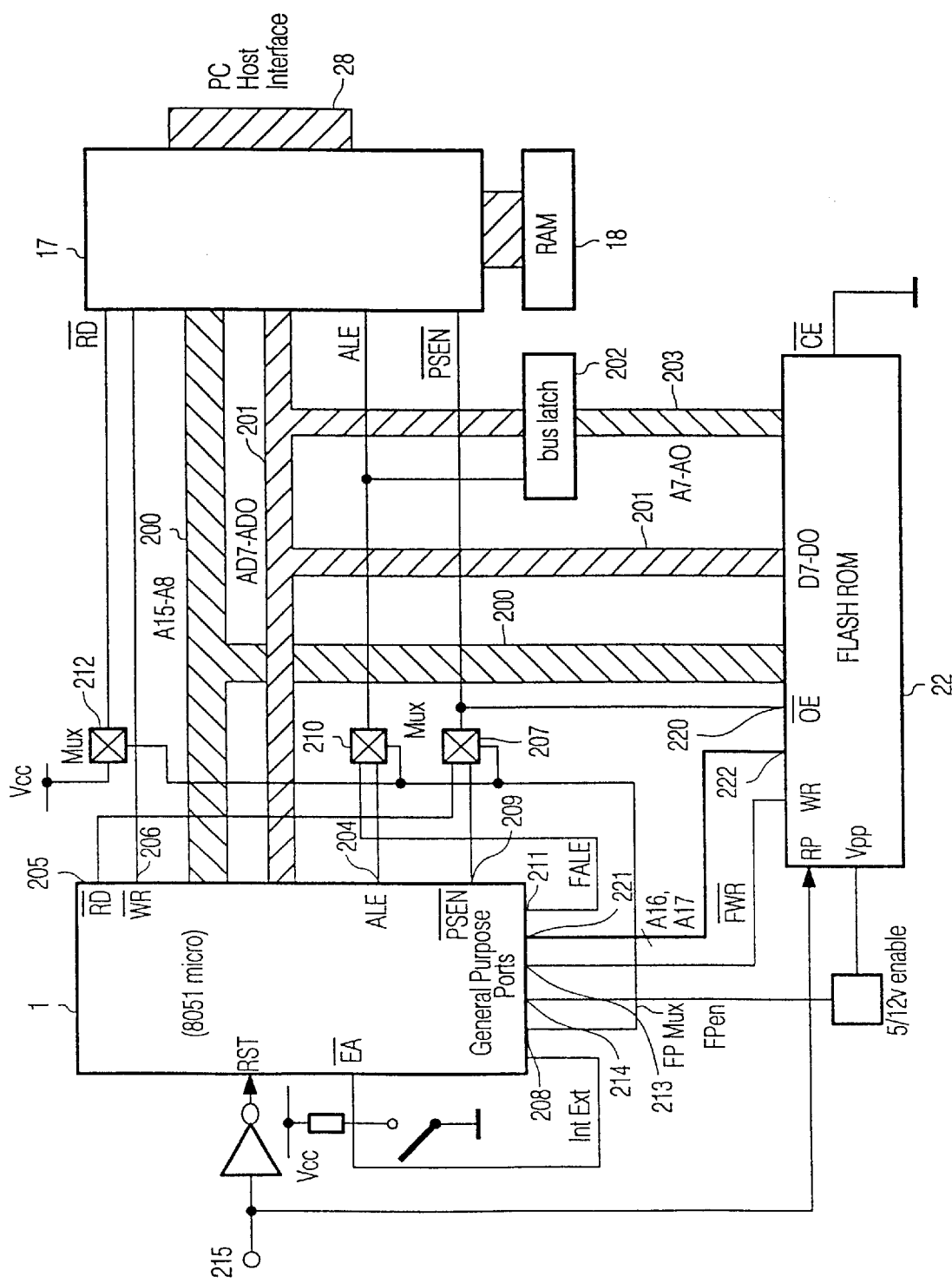
FIG. 2 is a block diagram showing in greater detail the interconnection of the system controller, block decoder/host computer interface, and program code memory of the optical disc drive of FIG. 1, and FIG. 3a and FIG. 3b is a flow diagram illustrating a process of restoring or updating program code in the program memory of the system controller of an optical disc drive according to the invention.

FIG. 2 shows in greater detail the interconnection of the microcontroller 1, the block decoder 17 and the FLASH memory 22. The microcontroller I is connected to the block decoder 17 and the flash memory 22 via an address bus 200 which conveys address bits A15 to A8 and via a combined data and address bus 201 which conveys in time multiplexed form either address bits A7 to A0 or data bits D7 to D0. A bus latch 202 enables address bits A7 to A0 to be held while the data bits D7 to D0 are applied to the bus 201, the address bits A7 to A0 being applied to the FLASH memory 22 via a bus 203. The latch 202 is enabled during normal operation of the disc drive by a signal address latch enable (ALE) produced at an output 204 of the microcontroller 1 and passed through a multiplexer 210. During re-programming of the FLASH memory 22 the latch 202 is enabled by a signal Flash Address Latch Enable (FALE) produced by the microcontroller 1 at an output port 211 via the multiplexer 210 controlled by a signal FPMux which is produced at an output port 208 of the microcontroller 1 when data is to be erased from or written into the FLASH memory 22. Outputs 205 and 206 of the microcontroller 1 provide read and write control signals, respectively, to the block decoder 17, while output 205 provides a read control signal to the FLASH memory 22 when FLASH memory updating is taking place via a multiplexer 207, the multiplexer 207 being controlled by the signal FPMux generated by the microcontroller 1. An output 209 of the microcontroller 1 provides a program store enable ($\overline{PSEN}$) signal which is applied to an input 220 of the FLASH memory 22 via the multiplexer 207 and which enables the micro controller 1 to access program code from the FLASH memory 22 during normal operation of the disc drive. A further multiplexer 212 controlled by the signal FPMux inhibits reading of data by the block decoder 17 during the re-programing of the FLASH memory 22. A signal $\overline{FWR}$ is produced at an output 213 of the microcontroller 1 to enable program code to be written to the FLASH memory 22 while a further signal FPen is produced at an output 214 of the microprocesor 1 to apply an enable voltage to the FLASH memory when it is desired to erase and re-write program code. In normal operation of the disc drive no voltage is applied to the FLASH memory 22 by this signal so that inadvertent modification of the FLASH memory 22 caused by program faults is suppressed. An input 215 receives a reset pulse when the drive is switched on so that the microcontroller 1 and FLASH memory 22 are set to an initial state where the microcontroller 1 starts to read program instructions from the protected area of the FLASH memory 22 and the contents of the FLASH memory 22 are checked to ensure that they have not become corrupted. A further output port 221 of the micro controller 1 provides address bits A16 and A17 to enable a larger capacity FLASH memory than can be directly addressed by the micro controller 1 to be used the FLASH memory being divided into a number of separately addressed pages.

The FLASH memory 22 includes basic bootstrapping program code which enables the microcontroller 1 to perform basic functions and to check whether the FLASH memory 22 contains uncorrupted program code to enable the disc drive to operate correctly. If the initialisation routine detects that the program code has been corrupted, for example because a failed attempt to update the program code has been made, it can signal a fault condition in response to which the user can cause the host computer to attempt to re-write the program code to the FLASH memory 22. The protected area of the FLASH memory 22 includes the program code necessary to enable the microcontroller to perform basic operations including indicating a fault condition to the user so that the user is alerted to the necessity to load the program code from the host computer into the disc drive. The program code in the protected area of the FLASH memory 22 also includes that necessary to enable the micro controller 1 to write the code transferred from the host computer into the RAM 18. The micro controller 1 also includes program ROM which contains the necessary sub-routines for writing program code from the RAM 18 into the FLASH memory 22. Consequently, even if the program code is lost from the unprotected area of the FLASH memory 22 and from the RAM 18 it can be reconstituted from the code supplied on floppy disc (or otherwise) using the host computer interface. It is, therefor,unnecessary for the user to resort to the manufacturer or a service organisation to restore the disc drive to working condition but rather it is only necessary to re-run the program mode to transfer the code from the host computer.

While in this embodiment low level code to perform the writing of data into the FLASH memory 22 is included in program ROM within the micro controller 1 and higher level program code is included within the protected area of the FLASH memory this particular partitioning is not essential to the performance of the invention but is of particular convenience in this embodiment. The code in the micro controller 1 contains particular sub routines which can be selected according to the particular type of FLASH memory (or other non volatile memory) used. It will be appreciated by those skilled in the art that FLASH memories produced by different manufacturers require different operations to erase and/or write data to them and these sequences are stored for a number of different memories within the microcontroller ROM. Thus the disc drive manufacturer is not confined to a single FLASH memory type and the micro controller does not have to be reprogrammed if a different type of FLASH memory is used.

Figure 3A:
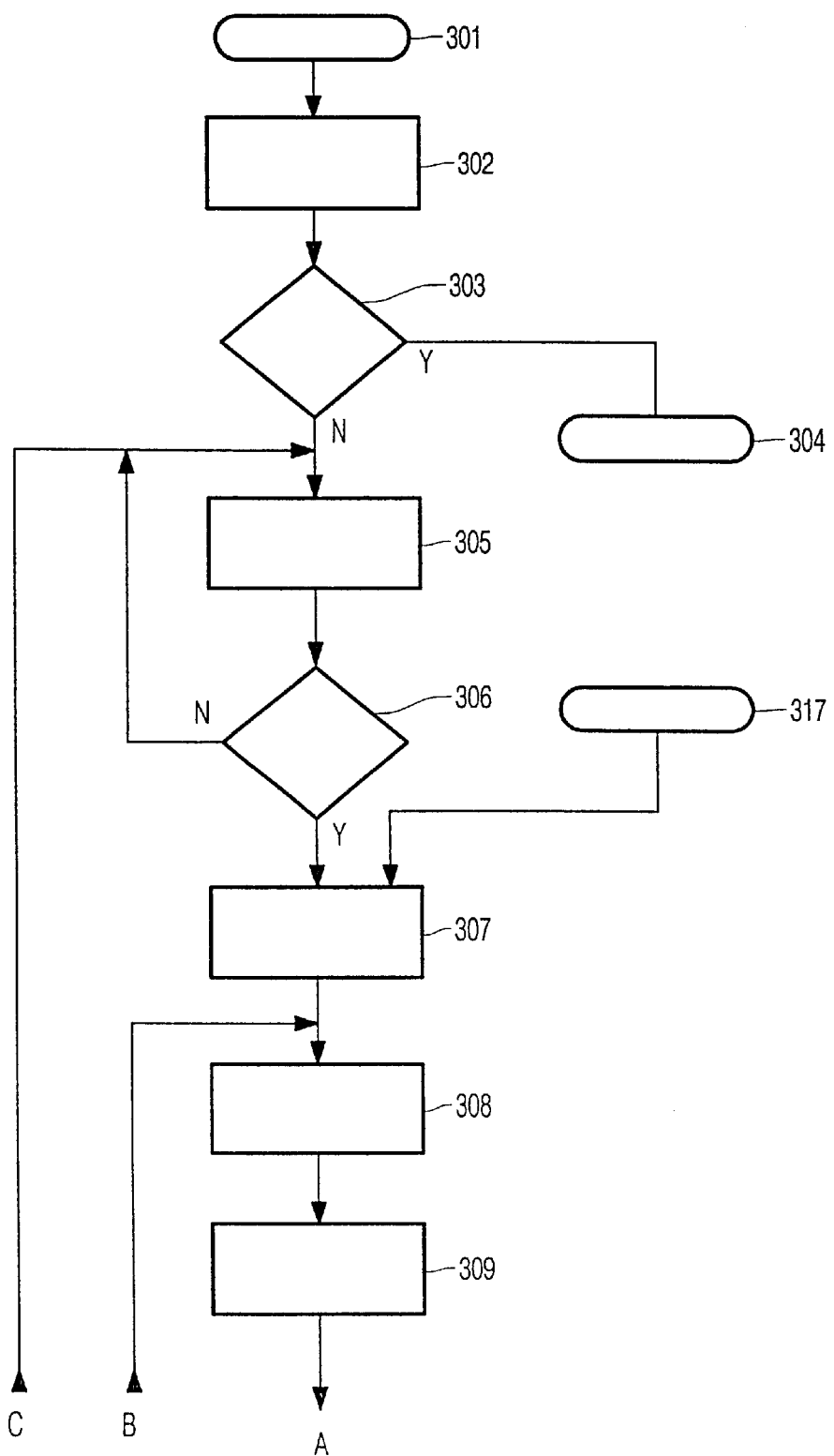
Figure 3B:
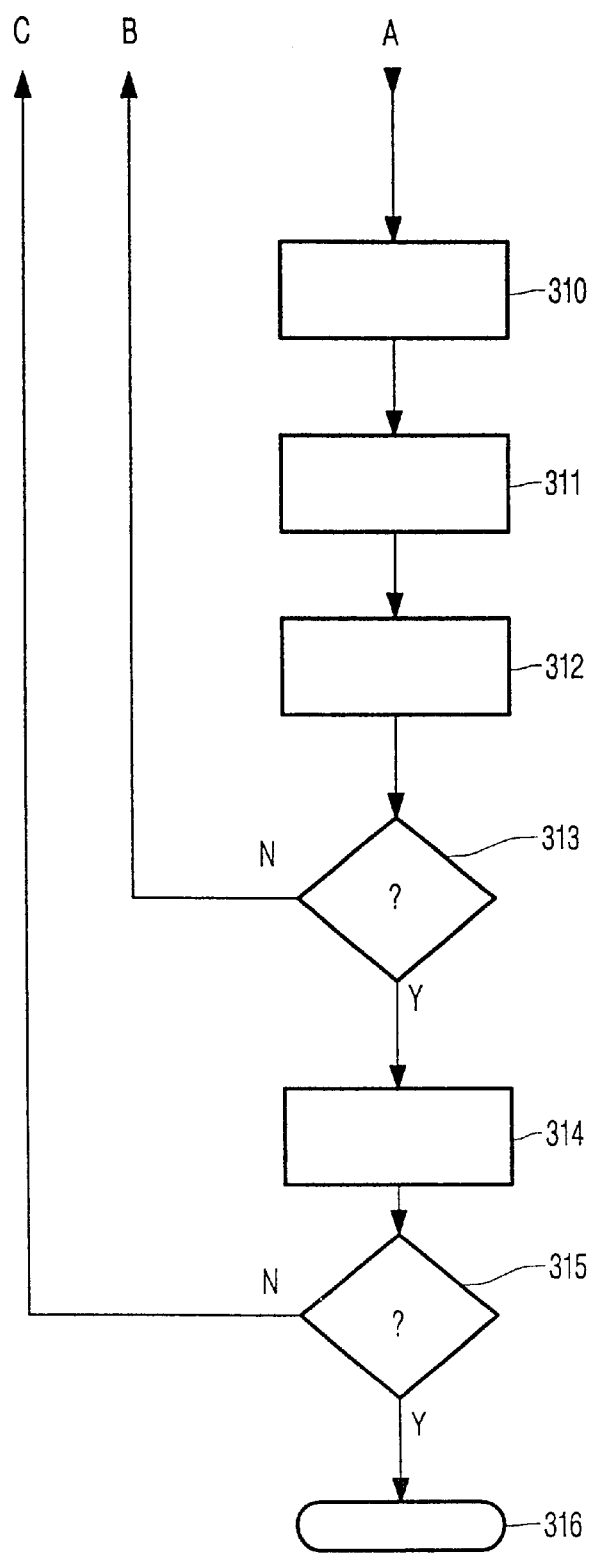

FIG. 3 is a flow diagram illustrating a method according to the invention of entering program code into the non volatile memory. On switch on the optical disc drive, Box 301, the first operation is to check the integrity of the contents of the FLASH memory 22, Box 302. This is performed under the control of program instructions stored in the protected are of the FLASH memory 22, i.e. that part of the FLASH memory 22 which cannot be erased under software control. If the check is performed successfully, output Y of the Box 303, then the process ends, Box 304. If the check indicates that the program code in the FLASH memory 22 has become corrupted, output N of Box 303, then a request is made to the host computer for the supply of uncorrupted program code Box 305. The most likely cause of corrupted program code is a power supply failure at a critical time during updating of the program code as discussed herein before. A loop is then entered in which it is detected when the host computer responds to the request, Box 306, and when the disc drive detects a response from the host computer it enters a program mode, Box 307, in which it prepares itself to receive the program code from the host computer and to write it into the FLASH memory 22. The first process in this procedure is to read N-bytes of program code from the host computer, Box 308. These N-bytes are stored in the RAM 18, Box 309. The next step in the procedure is to activate the FLASH memory program, Box 310, that is the program which enables the microcontroller 1 to erase the program code from the target area of the FLASH memory 22, Box 311, and then to transfer the N-bytes of code from the RAM 18 into the selected locations in the FLASH memory 22, Box 312. A check is then made, Box 313, as to whether all the program code has been transferred and if not the procedure loops back to the process of Box 308 so that the next N-bytes of program code are fetched from the host computer and the steps illustrated by Boxes 308 to 312 are repeated until all the program code has been transferred. When this process has been completed a check of the integrity of the program code in the FLASH memory 22 is carried out, Box 314, and a decision is taken, Box 315, as to whether the transfer has been successfully accomplished. If so the procedure ends, Box 316, but if not the procedure loops back to Box 305 where the host computer is asked to provide the program code and a further attempt to transfer the program code to the FLASH memory 22 is made.

The above procedure describes how the program code is restored in the FLASH memory 22 when it is detected on switch on that it has become corrupted. There is a further input to this procedure when it is desired to replace the current program code in the FLASH memory 22 by an updated version which may give the disc drive additional functionality. In this case the host computer issues a request, Box 317, to the disc drive to update the program code. This causes the disc drive to go into program mode, Box 307, and the procedure for updating the program code follows the same steps as that for restoring corrupted program code.

From reading the present disclosure, other modifications will be apparent to persons skilled in the art. Such modifications may involve other features which are already known in the design and use of optical disc drives and component parts thereof and which may be used instead of or in addition to features already described herein. Although claims have been formulated in this application to particular combinations of features, it should be understood that the scope of the disclosure of the present application also includes any novel feature or any novel combination of features disclosed herein either explicitly or implicitly or any generalisation of one or more of those features which would be obvious to persons skilled in the art, whether or not it relates to the same invention as presently claimed in any claim and whether or not it mitigates any or all of the same technical problems as does the present invention. The applicants hereby give notice that new claims may be formulated to such features and/or combinations of such features during the prosecution of the present application or of any further application derived therefrom.

What is claimed is:

1. A method for updating program code contained in non-volatile memory for a microcontroller which controls the operation of an optical disk drive connected to a host computer, the method comprising the steps of:

providing in a protected non-erasable area of the non-volatile memory, first program code for performing an integrity check of second program code in an unprotected rewritable area of the non-volatile memory and requesting and receiving updated second program code from the host computer;

providing in a read only memory (ROM) contained in the microcontroller, third program code for erasing data from and writing data to the unprotected rewritable area of the non-volatile memory;

checking the integrity of the second program code, and if the integrity check fails then:

requesting the host computer to supply updated second program code;

receiving the updated second program code into random access memory (RAM) within the disc drive;

erasing second program code from at least a selected portion of the unprotected area of the non-volatile memory; and writing the updated second program code from the RAM into at least the selected portion of the unprotected rewritable area of non-volatile memory.

2. The method of claim 1 in which the integrity of the second program code is checked after each interruption of power.

3. The method of claim 1 in which the integrity of the second program code is checked after writing updated second program code to at least the selected portion of the unprotected rewritable area.

4. The method of claim 1 further comprising the steps of activating a visible and/or audible indication if the integrity check fails.

5. The method of claim 1 in which the non volatile memory includes FLASH memory.

6. The method of claim 1 further comprising temporarily storing data read from a CD or DVD formatted disk in the RAM and transmitting the temporarily stored data from the RAM to the host computer.

7. The method of claim 1 further comprising the step of reading a CD or DVD formatted disk depending on the updated second program code.

8. The method of claim 1, further comprising the step of writing to a CD or DVD depending on the updated second program code.

9. The method of claim 1 in which:

the integrity is checked after each interruption of power;

the integrity is checked after each writing to the second non-protected area;

the method further comprises the steps of activating a visible and/or audible indication if the integrity check fails;

the non volatile memory includes FLASH memory;

the method further comprises the step of reading a CD ROM or DVD ROM formatted disk depending on the updated second program code; and the method further comprises the step of writing to the disk depending on the updated second program code.

10. An optical disc drive comprising:

a micro controller for controlling the operation of the disc drive in response to program code;

non volatile memory for storing program code, the non volatile memory including a first protected area where code is protected from erasure and a second non-protected area where code can be rewritten under the control of the micro controller, the first area containing program code to enable the micro controller to verify the integrity of the program code in the second area;

means for checking the integrity of the program code in the second area;

means for requesting updated program code from a host computer to which the disc drive is connected when the integrity check fails; and means for receiving the updated program code into a random access memory (RAM);

and wherein:

the micro controller includes program code stored in read only memory for erasing the second area of non-volatile memory and writing updated program code from the RAM into the second area of non-volatile memory.

11. The drive of claim 10 further comprising means to initiate checking program code integrity in the second non-protected area after each interruption of power.

12. The drive of claim 10 further comprising means to initiate checking program code integrity in the second non-protected area after each writing of updated program code into the second area.

13. The drive of claim 10 further comprising means to provide a visible and/or audible indication if the integrity check fails.

14. The drive of claim 10 in which the non-volatile memory includes FLASH memory.

15. The drive of claim 10 further comprising means for reading an optical disc according to the CD ROM or DVD ROM formats depending on the program code in the second non-protected area.

16. The drive of claim 15 in which the RAM is arranged for temporarily storing data read from the optical disc before transfer to the host computer.

17. The drive of claim 10 further comprising means to write to an optical disk depending on the program code in the second non-protected area.

18. The drive at claim 10 in which:

the drive further comprises means to initiate checking program code integrity in the second non-protected area after each interruption of power;

the drive further comprises means to initiate checking program code integrity in the second non-protected area after each writing of updated program code into the second area;

the drive further comprises means to provide a visible and/or audible indication if the integrity check fails;

the RAM includes RAM associated with block decoder means for temporarily storing data read from an optical disc before transfer to the host computer;

the non-volatile memory includes FLASH memory;

the drive further comprises means for reading from an optical disc according to the CD ROM or DVD ROM formats depending on the program code in the second non-protected area; and the drive further comprises means for writing to an optical disk depending on the program code in the second non-protected area.

19. A computer peripheral device connected to a host computer, comprising:

a micro controller for controlling the operation of the peripheral device in response to program code;

non volatile memory for storing program code, the non volatile memory including a first protected area where code is protected from erasure and a second non-protected area where code can be rewritten under the control of the micro controller, the first area containing program code to enable the micro controller to verify the integrity of the program code in the second area;

means for checking the integrity of the program code in the second area;

means for requesting updated program code from a host computer to which the disc drive is connected when the integrity check fails; and means for receiving the updated program code into a random access memory (RAM);

and wherein:

the micro controller includes program code stored in read only memory for erasing the second area of non-volatile memory and writing updated program code from the RAM into the second area of non-volatile memory.

* * * * *